United States Patent
Chan et al.

(10) Patent No.: US 8,385,083 B2
(45) Date of Patent: Feb. 26, 2013

(54) METHOD AND SYSTEM FOR ISOLATING LOCAL AREA NETWORKS OVER A CO-AXIAL WIRING FOR ENERGY MANAGEMENT

(75) Inventors: Tat Keung Chan, South San Francisco, CA (US); Elsa A. Chan, San Francisco, CA (US)

(73) Assignee: Jetlun Corporation, South San Francisco, CA (US)

( * ) Notice: Subject to any disclaimer, the term of this patent is extended or adjusted under 35 U.S.C. 154(b) by 397 days.

(21) Appl. No.: 12/559,486

(22) Filed: Sep. 14, 2009

(65) Prior Publication Data

US 2010/0284163 A1  Nov. 11, 2010

Related U.S. Application Data

(60) Provisional application No. 61/204,820, filed on Jan. 13, 2009.

(51) Int. Cl.
*H05K 9/00* (2006.01)
*H05K 1/18* (2006.01)
*H01B 7/18* (2006.01)
*H01B 9/02* (2006.01)

(52) U.S. Cl. ............... 361/818; 174/105 R; 361/763

(58) Field of Classification Search ............... 455/402, 455/63.1, 114.2; 174/357, 393, 394, 36, 174/105 R, 105 SC, 106 R, 106 SC, 115, 174/107; 702/61, 57, 60, 64, 38, 65, 68, 702/186, 198, 188, 189; 709/221; 705/35

See application file for complete search history.

(56) References Cited

U.S. PATENT DOCUMENTS

| | | | | | |
|---|---|---|---|---|---|
| 3,574,016 | A | * | 4/1971 | Wahlberg | 156/54 |
| 4,899,217 | A | * | 2/1990 | MacFadyen et al. | 725/80 |
| 5,132,491 | A | * | 7/1992 | Mulrooney et al. | 174/36 |
| 6,624,532 | B1 | * | 9/2003 | Davidow et al. | 307/39 |
| 6,724,891 | B1 | * | 4/2004 | Huang et al. | 379/399.01 |
| 6,751,563 | B2 | * | 6/2004 | Spanier et al. | 702/61 |
| 6,897,822 | B2 | * | 5/2005 | Sparks et al. | 343/767 |
| 7,031,458 | B2 | * | 4/2006 | Holcombe et al. | 379/399.02 |
| 7,184,428 | B1 | * | 2/2007 | Gerszberg et al. | 370/352 |
| 7,245,625 | B2 | * | 7/2007 | Manis et al. | 370/401 |
| 7,310,522 | B2 | * | 12/2007 | Geile | 455/424 |
| 7,596,079 | B2 | * | 9/2009 | Berkman et al. | 370/201 |
| 7,804,859 | B2 | * | 9/2010 | Landry et al. | 370/535 |
| 2002/0145509 | A1 | * | 10/2002 | Karny et al. | 340/310.06 |
| 2003/0039257 | A1 | * | 2/2003 | Manis et al. | 370/400 |

(Continued)

OTHER PUBLICATIONS

International Search Report for PCT/US2010/020914 filed Jan. 13, 2010.

(Continued)

*Primary Examiner* — Lisa Lea Edmonds
*Assistant Examiner* — Xanthia C Cunningham
(74) *Attorney, Agent, or Firm* — Richard T. Ogawa; Ogawa P.C.

(57) ABSTRACT

An energy management system. The system includes a coax controller apparatus comprising an exterior housing and plurality of coax modules numbered from 2 through N, where N is an integer greater than 3. In a specific embodiment, each of the coax modules comprises a powerline chip (PLC) module coupled to an analog front end, which is coupled to a coaxial connector. The system also has an electromagnetic shield configured to each of the coax modules. In a specific embodiment, the electromagnetic shield is configured to substantially maintain the coax module substantially free from interference noise or other disturbances. The system has a power meter coupled to one or more ports of the coax controller apparatus.

4 Claims, 20 Drawing Sheets

U.S. PATENT DOCUMENTS

2006/0079198 A1* 4/2006 Sanderson ............... 455/402
2006/0218593 A1* 9/2006 Afshary et al. ............. 725/74
2007/0171052 A1* 7/2007 Moriwaki ............... 340/539.22
2007/0198748 A1* 8/2007 Ametsitsi et al. ........... 709/249
2007/0259644 A1* 11/2007 Chan et al. ................ 455/402
2007/0280246 A1* 12/2007 Berkman et al. ............ 370/392
2008/0154624 A1* 6/2008 O'Neil ..................... 705/1
2009/0212926 A1* 8/2009 Du et al. ................ 340/310.11
2009/0212971 A1* 8/2009 Casey et al. ............. 340/870.02
2009/0327384 A1* 12/2009 Petrovic .................... 708/300

OTHER PUBLICATIONS

Written Opinion of the International Searching Authority for PCT/US2010/020914 filed Jan. 13, 2010.

* cited by examiner

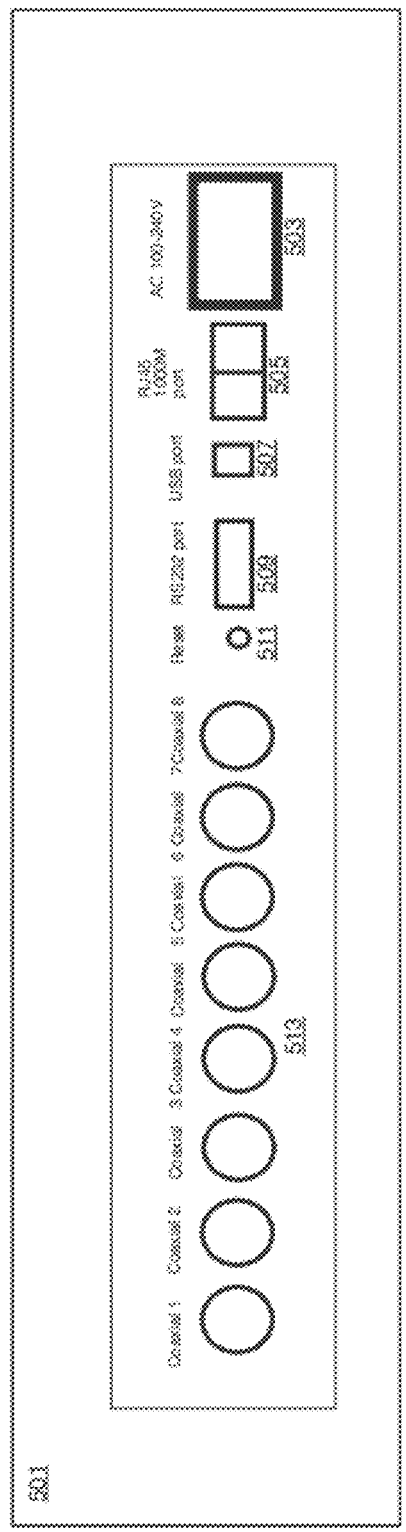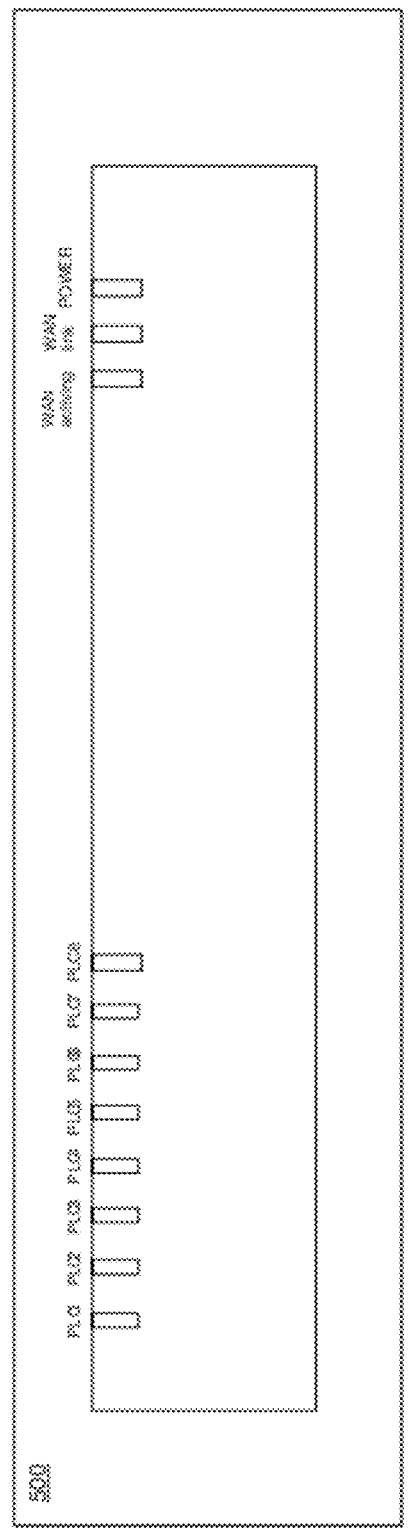
FIG. 5

METHOD AND SYSTEM FOR ISOLATING LOCAL AREA NETWORKS OVER A CO-AXIAL WIRING FOR ENERGY MANAGEMENT

CROSS-REFERENCES TO RELATED APPLICATIONS

This application claims priority to U.S. Provisional Application No. 61/204,820 filed Jan. 13, 2009, commonly assigned and incorporated by reference herein for all purposes.

STATEMENT AS TO RIGHTS TO INVENTIONS MADE UNDER FEDERALLY SPONSORED RESEARCH AND DEVELOPMENT

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright (c) 2009, Jetlun Corporation, All Rights Reserved.

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to energy management techniques. More particularly, the present invention provides a method and system for isolating local area networks over at least a co-axial wiring for energy management, but it can be applied to many other applications.

As larger universities and research labs obtained more computers during the late 1960s, increasing pressure mounted to provide high-speed interconnections to share information across a common network, often referred to as a Local Area Network (LAN). The development and proliferation of DOS-based personal computers from the early 1980's and the introduction of the World-Wide Web (WWW), which enabled the spread of information over the Internet through an easy-to-use and flexible format, popularized the adoption of home networking. A home network is a residential LAN, and is used to connect multiple devices within the home. More recently Internet Service Providers (ISP) such as AT&T and British Telecom have been using home networking to provide triple play services (voice, video and data) to customers.

Early LAN cabling used for LAN had always been based on various grades of co-axial cable, but IBM's Token Ring used shielded twisted pair cabling of their own design, and in about 1984 StarLAN showed the potential of simple CAT3 unshielded twisted pair—the same simple cable used for telephone systems. This led to the development of 10Base-T (and its successors) and structured cabling which is still the basis of most LANs today. Structural cabling is most cost efficient in new facilities but it becomes technically challenging and cost prohibitive in existing facilities. Given that the majority of buildings are existing and new buildings are just a small percentage of the overall market, other technologies were developed that transmit data either over the air or through the use of existing wiring.

As new applications such as Internet Protocol Television (IPTV)—a system where a digital television service is delivered using Internet Protocol over a network infrastructure, which may include delivery by a broadband connection, and Video of Demand (VoD)—a system that either stream content through a set-top box, allowing viewing in real time, or download it to a device such as a computer, digital video recorder, personal video recorder or portable media player for viewing at any time, matures, the bandwidth requirement for a LAN will need to be increased to be able to support these applications.

Wireless 802.11 technologies are limited in bandwidth, coverage, interferences and security. Other network technologies that use the existing wiring of a facility such as HomePNA Phoneline and HomePlug™ Powerline uses bare copper wires which are easily susceptible to interferences and they are also limited by its shared medium; thus, making it extremely challenging to deploy bundled applications and services. A co-axial wire is a cable consisting of an inner conductor, surrounded by a tubular insulating layer typically made from a flexible material with a high dielectric constant, all of which is then surrounded by another conductive layer (typically of fine woven wire for flexibility, or of a thin metallic foil), and then finally covered again with a thin insulating layer on the outside—making it the most ideal network infrastructure for high-bandwidth applications that is part of the existing wiring of a facility.

Although highly successful, networking techniques have not been used successfully in energy management applications. That is, energy management applications have been crude and often difficult to use in an easy and convenient manner. Energy management applications are also non-existent in some areas. These and other limitations of conventional energy management techniques have been described throughout the present specification and more particularly below.

From the above, it is seen that improved techniques are desired to improve use of existing co-axial wiring for LAN and in particularly energy management applications.

BRIEF SUMMARY OF THE INVENTION

According to the present invention, techniques related to maximizing the use of existing co-axial wiring for networking are provided. More particularly, the present invention provides a method to isolate networks over existing co-axial wiring of a facility. Merely by example, the invention provides a network solution to support various applications such as data networking, Voice over Inter Protocol (VoIP), Internet Protocol Television (IPTV), or Video on Demand (VoD), for a variety of environments such as a hospital, an apartment building, a hotel, a ship, a home, a shopping mall, or other distribution center or warehouse, school or large campus, office setting or large building area environment, manufacturing campuses.

According to one or more embodiments of the present invention, techniques have been provided using at least co-axial wiring in deployments of a larger network where a host device is connected to and managing N clients, where N is greater than 1. Placing multiple conventional co-axial wiring together causes interferences, which hinder overall bandwidth and performance. MOCA, Ultra-Wide Band (UWB), HomePNA and HomePlug Powerline and other network technologies see its performance drop when deployed due to the physical limitations of the co-axial wiring. The present method and system, however, overcomes some if not all of the limitations of conventional coaxial based systems and methods.

An energy management system is provided in one or more embodiments. The system includes a coax controller apparatus comprising an exterior housing and plurality of coax modules numbered from 2 through N, where N is an integer greater than 3. In a specific embodiment, each of the coax modules comprises a powerline chip (PLC) module coupled to an analog front end, which is coupled to a coaxial connector. The system also has an electromagnetic shield configured to each of the coax modules. In a specific embodiment, the electromagnetic shield is configured to substantially maintain the coax module substantially free from interference noise or other disturbances. The system has a power meter coupled to one or more ports of the coax controller apparatus.

In an alternative specific embodiment, the present invention provides a high speed network system for energy management. The system has a first shield configured to an analog front end coupled to a power line chip set configured for a data rate of at least 200 Megabits per second, and one or more interface ports. In a preferred embodiment, the first shield is configured to remove noise ranging from 1 MHz to 30 MHz derived from at least the analog front end. The system also has a second shield configured to the analog front end coupled to one or more inductive coupling elements. The one or more inductive coupling elements are configured to couple a power line signal from the analog front end to one or more coax connectors. The second shield is configured to block noise from being transmitted to and from at least the one or more inductive coupling elements. In a specific embodiment, the system has a third shield configured between the analog front end and the power line module. Preferably, the third shield is configured to isolate one or more powerline signals communicated between the analog front end and the power line module. A fourth shield is configured to one or more cables to form a shielded cable coupled to the one or more coax connectors. Of course, there can be other variations, modifications, and alternatives.

In one or more other embodiments, the present invention provides a way of using the system described herein to transfer energy consumption information using one or more power line signals over one or more powerline networks. Of course, there can be other variations, modifications, and alternatives.

Numerous benefits are achieved using the present invention over conventional techniques. The present invention maximizes the use of existing co-axial wiring of a facility, provides an easy and quick method to deploy a LAN and do away with new structure cabling which are attributable to global warming. In a preferred embodiment, the present system provides an improved shielding technique for power line communication of energy management applications, which tend to be noisy and have other disturbances. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 5 is a simplified front and back view of the controller according to an embodiment in the present invention;

DETAILED DESCRIPTION OF THE INVENTION

According to the present invention, techniques for converting co-axial wiring of a facility into a communication network that can be isolated into sub-networks in order to maximize bandwidth and decrease interference are provided. Merely by way of example, the invention has been applied in a local area network environment, but it would be recognized that other applications exist. The invention can also be applied to building area network, home area network, office network, apartments, factories, industrial area network, any combination of these, and other networking applications.

Figure 1:
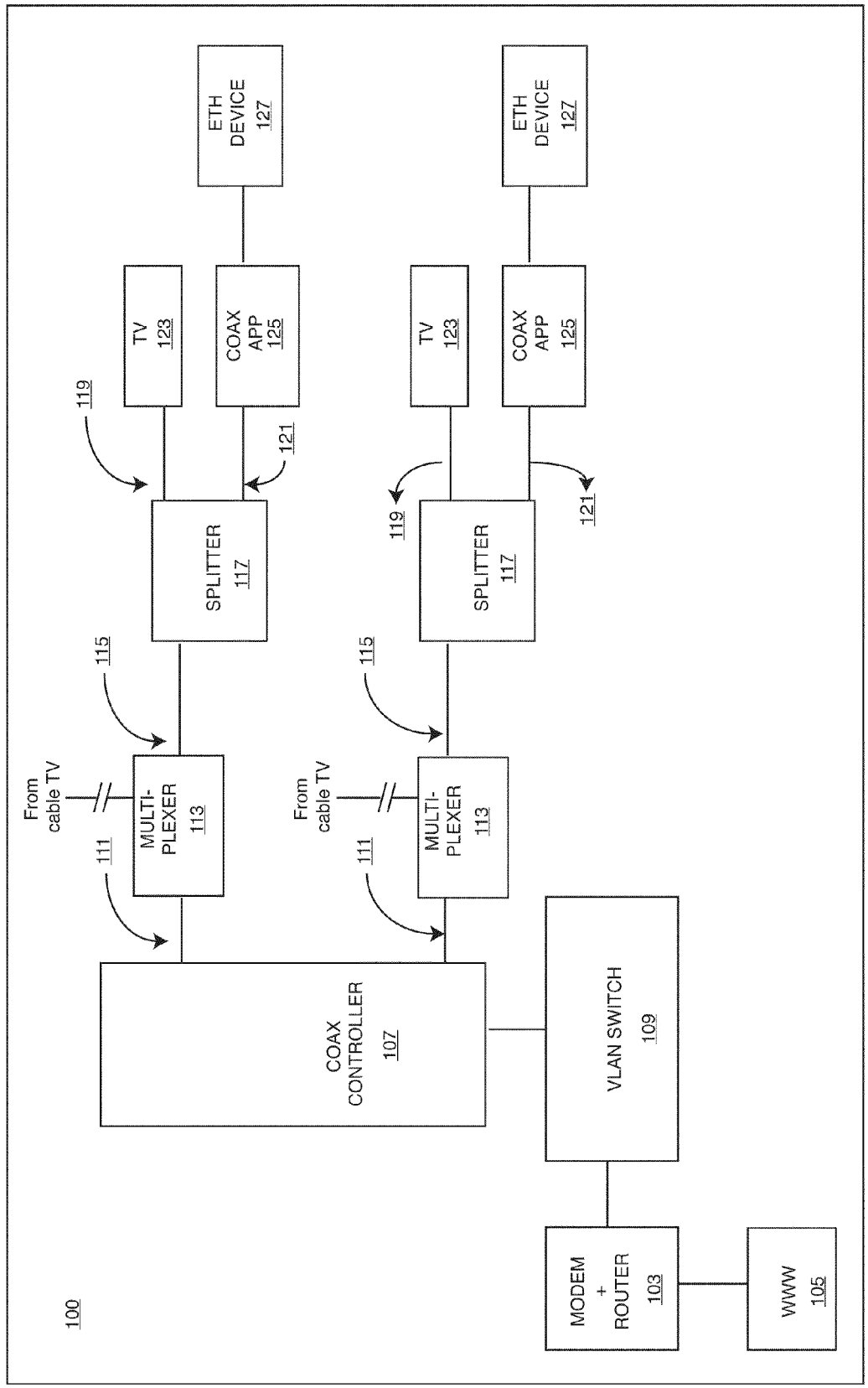
FIG. 1 is a simplified diagram of the system according to an embodiment in the present invention.

FIG. 1 is a simplified diagram of a co-axial system 100 according to an embodiment of the present invention. This diagram is merely an example, which should not unduly limit the scope of the claims herein. One of the ordinary skills in the art would recognize many variations, alternatives, and modifications. As shown, the system 100 for a co-axial local area network is included. The system 100 has an external data source 105, which is derived from a modem or router 103 that connects to the world-wide networks of computers or world-wide web (WWW) 105 and provides multiple IP address to the system 100. A co-axial controller 107 is coupled to the external data source 103 through a virtual local area network (VLAN) switch 109 that is coupled to the modem or router 103, and is then coupled to a plurality of co-axial wires 111.

The co-axial controller 107 is adapted to receive and transmit information. As merely an example, the co-axial controller is a product manufactured by Jetlun Corporation of South San Francisco, Calif., under the part number RD61230. The co-axial controller 107 is a local area network device that splits a first input/output port and a plurality of second input/output ports. Each of the second input/output ports is numbered from 1 through N, where N is an integer greater than 1. A multiplexer 113 is connected to each of the second input/output ports and is then connected to a splitter 117 through a co-axial wire, which then connects to a co-axial apparatus 125. The multiplexer 113 is adapted to combine an IP signal 121 with a cable TV signal 119 over a single co-axial wire 115, and receive and transmit information. As merely an example, the multiplexer 113 is a product manufactured by Jetlun Corporation of South San Francisco, Calif., under the part number RD61228. The splitter 117 is adapted to separate the combined signal on the co-axial wire 115 to an IP signal 121 and a cable TV signal 119 and receive and transmit information. As merely an example, the splitter 117 is a product manufactured by Jetlun Corporation of South San Francisco, Calif., under the part number RD61229. The co-axial apparatus 125 is adapted to convert the signal from co-axial to an IP signal and can receive and transmit information. As merely an example, the co-axial apparatus is a product manufactured by Jetlun Corporation of South San Francisco, Calif., under the part number RD61227.

Figure 2:
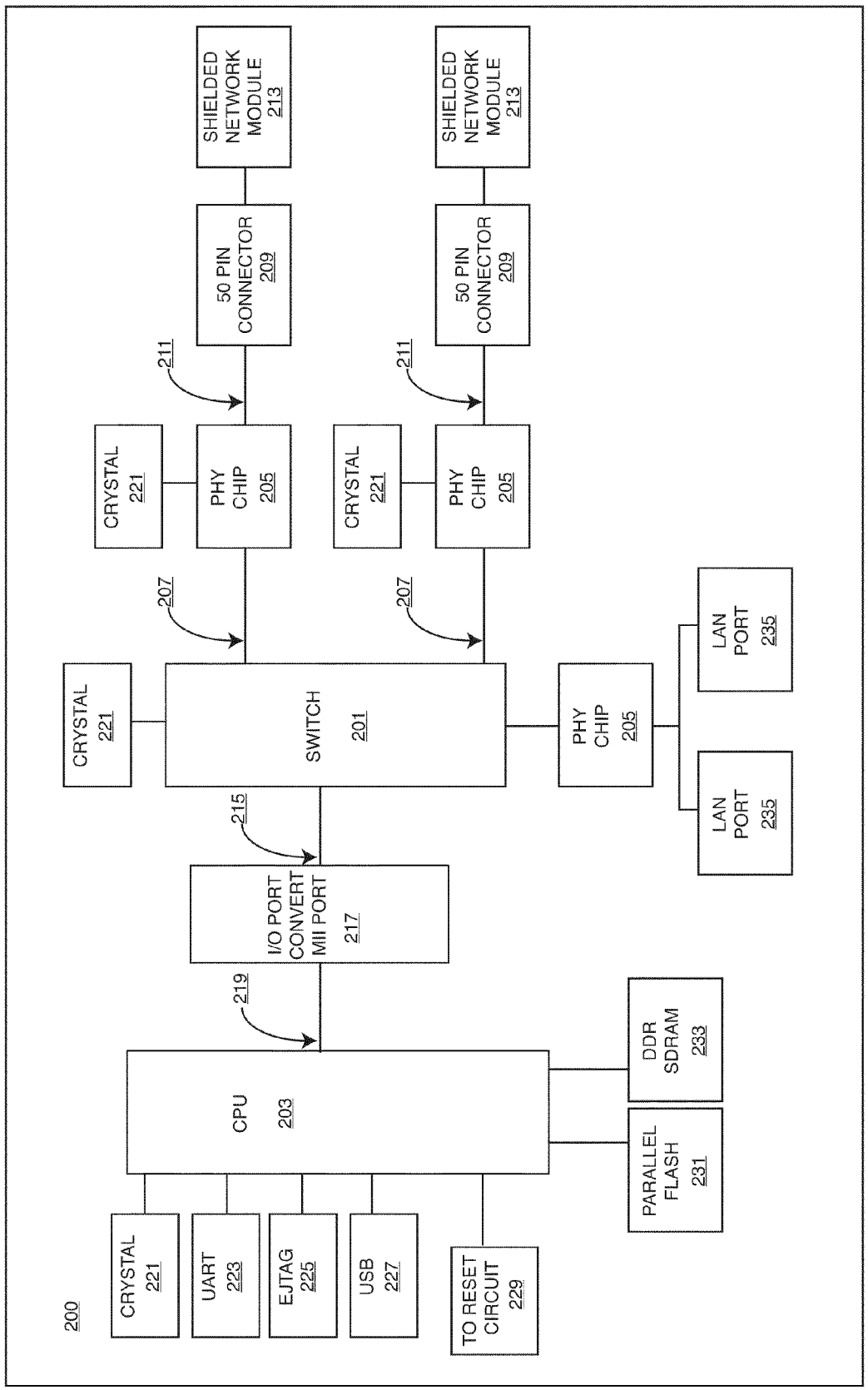
FIG. 2 is a simplified block diagram of controller that illustrates the shielded simple module used to isolate into sub-networks and the VLAN switch used to segregate networks according to an embodiment in the present invention.

FIG. 2 is a more detailed block diagram of a co-axial controller 200, according to an embodiment of the present invention. This diagram is merely an example, which should not unduly limit the scope of the claims herein. One of the ordinary skills in the art would recognize many variations, alternatives, and modifications exist. As shown, the co-axial controller 200 includes a variety of elements. Such elements include a network switch chipset 201 that interfaces between the Central Processing Unit (CPU) 203 and a plurality of Physical layer (PHY) chipset 205, numbered from 1 through N, where N is an integer greater than 1. The network switch chipset 201 is couple to the plurality of PHY chipset 205 through a Media Dependant Interface (MDI) or a Media Dependant Interface Crossover (MDIX) interface 207. Each Physical layer (PHY) chipset 205 is connected to an aluminum alloy tin shielded network module 213 through a 50-pin connector 209. The network switch chipset 201 is connect to the CPU 203 through a MII BUS 215 that is connected to a I/O-MII port 217, which converts the MII BUS 215 to an I/O BUS 219, and then to the CPU 203. The CPU 203 interfaces with various elements. Such elements include a Crystal 221, a Serial interface ("UART") 223, a Debug port ("EJTAG") 225, a USB port 227, a reset circuit 229, a parallel flash chip 231, and a DDR SDRAM chip 233. The network switch chipset 201 is also connected to an additional PHY chipset 205 that interfaces with two 1-Gigabit Ethernet ports 235.

Figure 3:
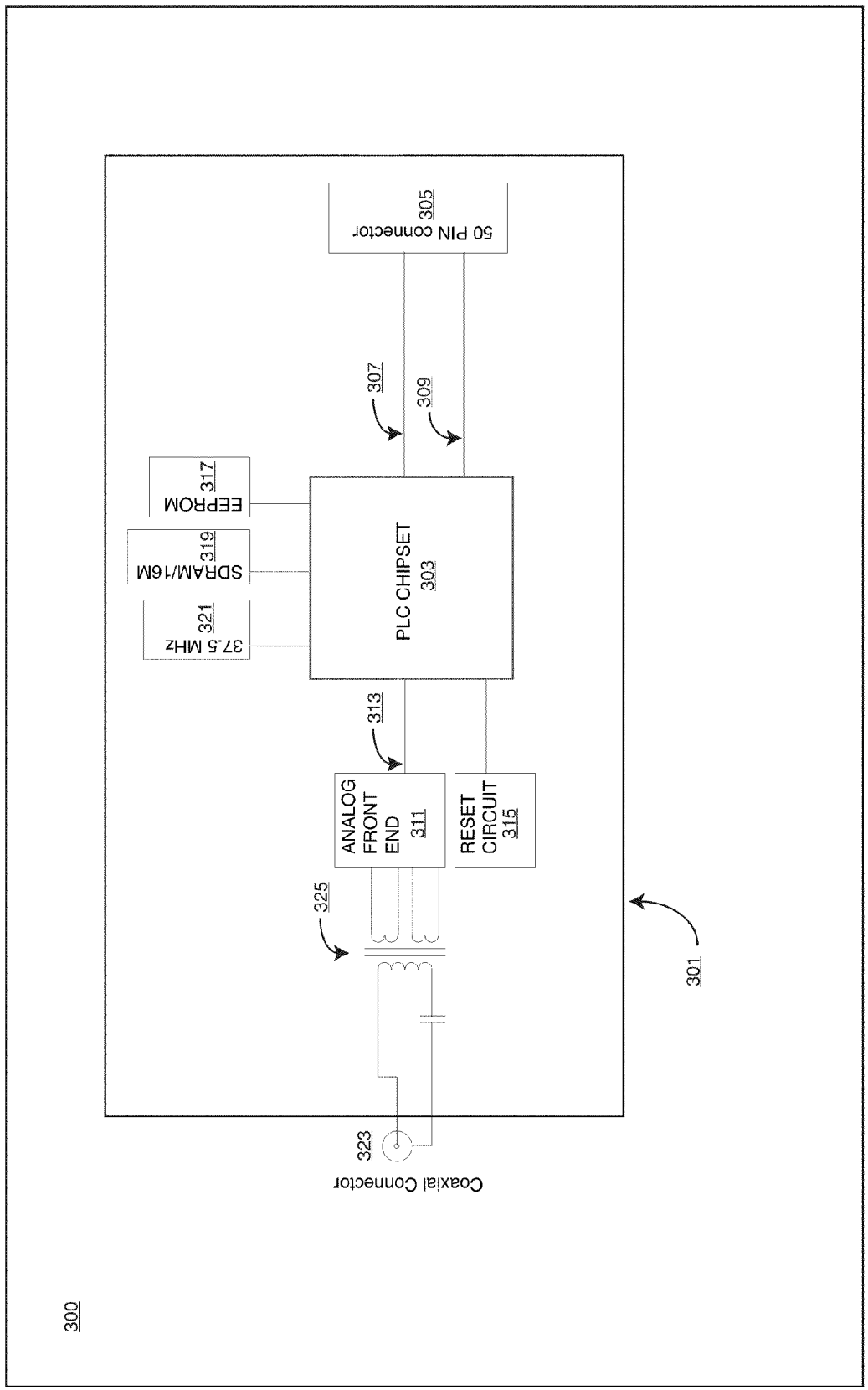
FIG. 3 is a simplified diagram illustrating isolated 1 thru N shielded simple modules within the controller according to an embodiment in the present invention.

FIG. 3 is a more detailed block diagram of a shielded network module 300 that is inside the coaxial controller, according to an embodiment of the present invention. This diagram is merely an example, which should not unduly limit the scope of the claims herein. One of the ordinary skills in the art would recognize many variations, alternatives, and modifications exist. As shown, the shielded network module 300 includes a variety of features. Such features include a mechanical aluminum alloy shield 301 that prevent signal degradation, interferences, and leakages, or any combination herein. The aluminum alloy shield 301 isolates each shielded network module into a separate network. Within the shielded network module 300 includes elements. Such elements include a powerline chipset 303 that interfaces between the 50-pin connector 305 through a Power Bus 307 and a MII Bus 309, an analog front end 311 through a databus 313, and a reset circuit 315. The powerline chipset 303 also interfaces with EEPROM 317, SDRAM 319 and 37.5 MHZ 321. The analog front end 311 couples to a co-axial connector 323 through a powerline coupler 325.

As merely an example, the powerline chipset 300 can feature an integrated powerline chipset manufactured by INTELLON CORPORATION of Florida, according to an embodiment of the present invention, but it would be recognized that other chipsets could be utilized. Here, the chip can be a single-chip powerline networking controller with integrated MII/GPSI, USB. The chip interfaces with Ethernet interfaces, among others. Preferably, there is at least a 200 Mbps data rate on the co-axial wire, although others may be desirable, such as 7.5 Kbps, 1 Mbps, 14 Mbps, 85 Mbps, 400 Mbps and 1 Gbps. In alternative embodiments, the shielded network module 300 can include other chipset designs that are suitable for the present methods and systems such as other powerline chipsets from suitable companies such as DS2, Panasonic, Coppergate, Sigma, Arkados, Yitran, Echelon, and others', as well as other networking technologies that are suitable for the present methods and systems such as Home-PNA, MoCA, and UWB network chipsets from Coppergate, Entropic, and others. As noted, the chipsets and companies mentioned are merely an example and should not unduly limit the scope of the claims herein.

Figure 4:
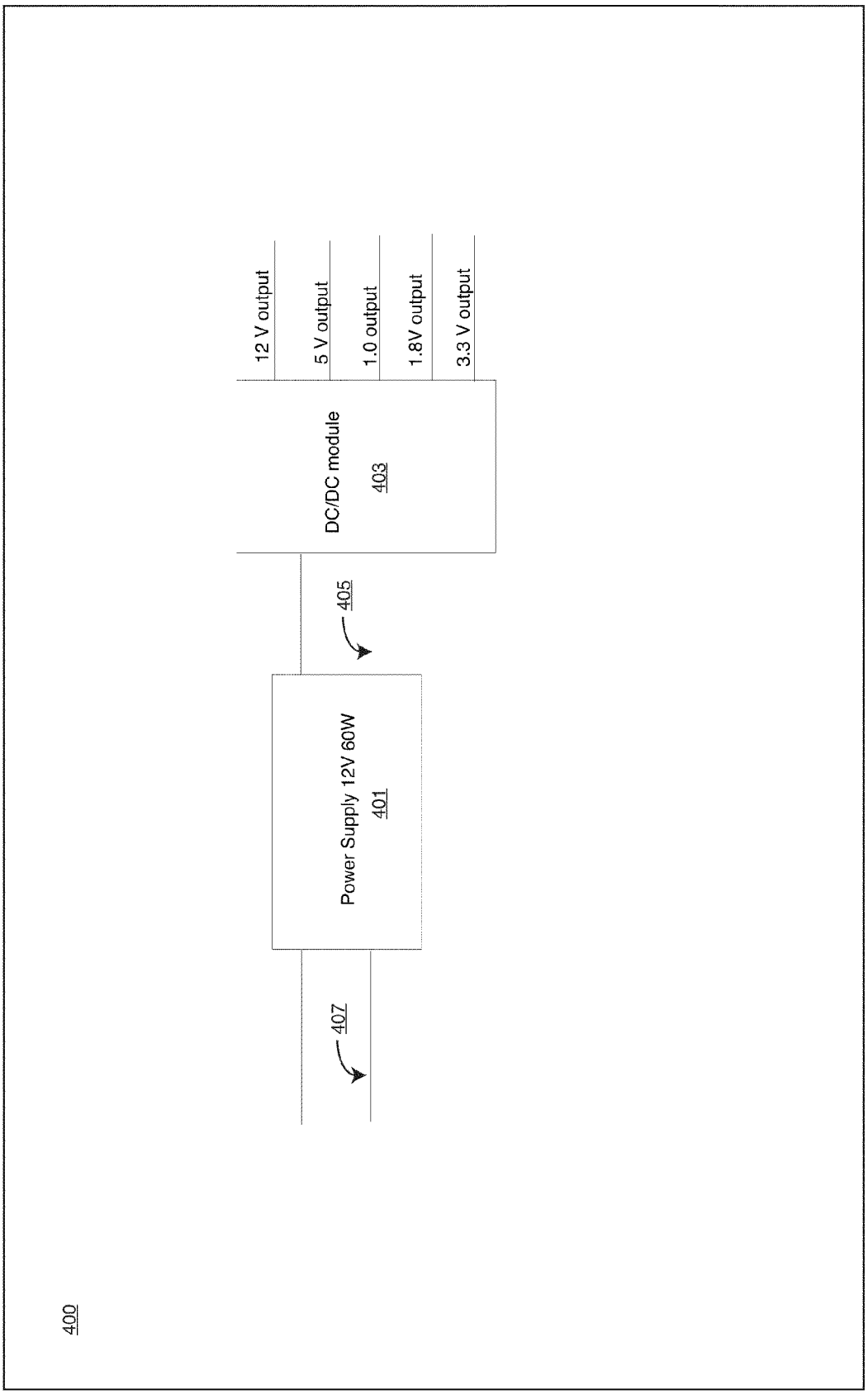
FIG. 4 is a simplified block diagram of the external power supply to the controller according to an embodiment in the present invention.

FIG. 4 is a more detailed block diagram of an external power supply 400 of the co-axial controller, according to the embodiment of the present invention. This diagram is merely an example, which should not unduly limit the scope of the claims herein. One of the ordinary skills in the art would recognize many variations, alternatives, and modifications exist. As shown, the external power supply includes various elements. Such elements include a 12V 60 W power supply 401 that interfaces between a DC/DC module 403 through a 12V output 405 and an AC 90-240V input 407. The DC/DC module 403, can provide a variety of outputs, such as 12V, 5V, 1.0V, 1.8V, 3.3V, according to the embodiment of the present invention.

FIG. 5 is a simplified front-view 500 and back-view 501 of the coaxial controller, according to an embodiment of the present invention. This diagram is merely an example, which should not unduly limit the scope of the claims herein. One of the ordinary skills in the art would recognize many variations, alternatives, and modifications exist. As shown, the co-axial controller has an outer casing. The outer casing is preferably a plastic but can also be a metal or any combination of plastic and/or metal. As merely an example, shown on the back-side of the co-axial controller 501, the apparatus has a 110/240 VAC DC connector 503, two 8-pin Ethernet jack for networking 505, a USB port 507, a RS232 port 509, a reset switch 511, and eight co-axial connectors 513. In the front-side 500, various light emitting diodes (LEDs) are shown to indicate connectivity on the back of the apparatus.

Figure 6:
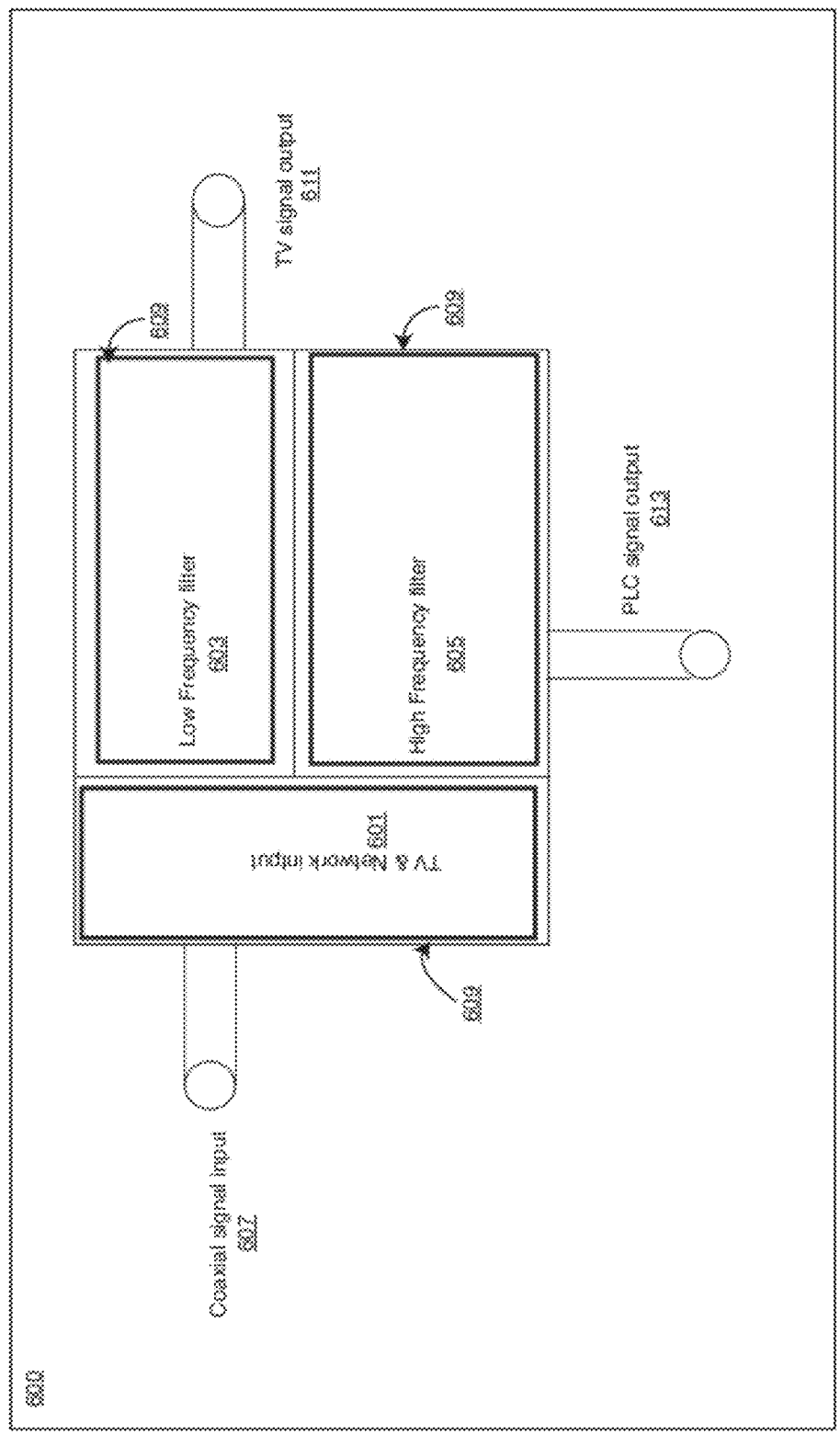
FIG. 6 is a simplified block diagram of the signal splitter according to an embodiment in the present invention.

FIG. 6 is a simplified block diagram of the signal splitter 600, according to an embodiment in the present invention. This diagram is merely an example, which should not unduly limit the scope of the claims herein. One of the ordinary skills in the art would recognize many variations, alternatives, and modifications exist. As shown, the splitter includes a variety of elements. Such elements include a cable TV & network input module 601, low frequency filter 603, and a high frequency filter 605. The cable TV & network Input module 601 has a cable signal input 607 and is shielded with alloy aluminum tin 609 that prevent any signal degradation, interference, leakage, or any combination thereof. The low frequency filter 603 has a cable TV output 611 and is shielded with alloy aluminum tin 609. The high frequency filter 605 has a network IP output 613 and is shielded with alloy aluminum tin 609.

Figure 7:
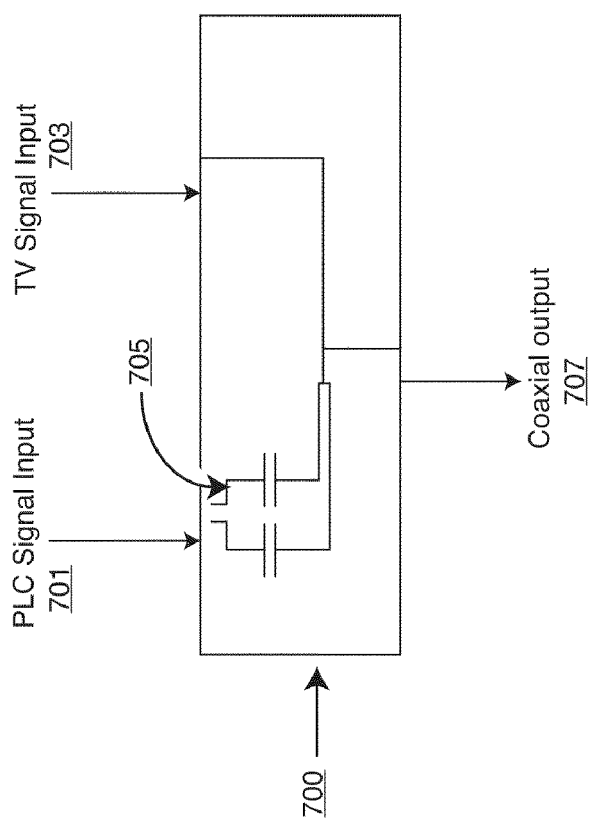
FIG. 7 is a simplified block diagram of the multiplexer according to an embodiment in the present invention.

FIG. 7 is a simplified block diagram of the multiplexer 700, according to an embodiment in the present invention. This diagram is merely an example, which should not unduly limit the scope of the claims herein. One of the ordinary skills in the art would recognize many variations, alternatives, and modifications exist. As shown, the multiplexer includes a variety of elements. Such elements include a powerline network signal input 701 and a cable TV signal input 703. A high frequency coupling capacitor 705 combines the powerline network signal input 701 and the cable TV signal input 703 and transmits both signals over the co-axial output 707. The multiplexer 700 can both transmit and receive signals bi-directionally.

Figure 8:
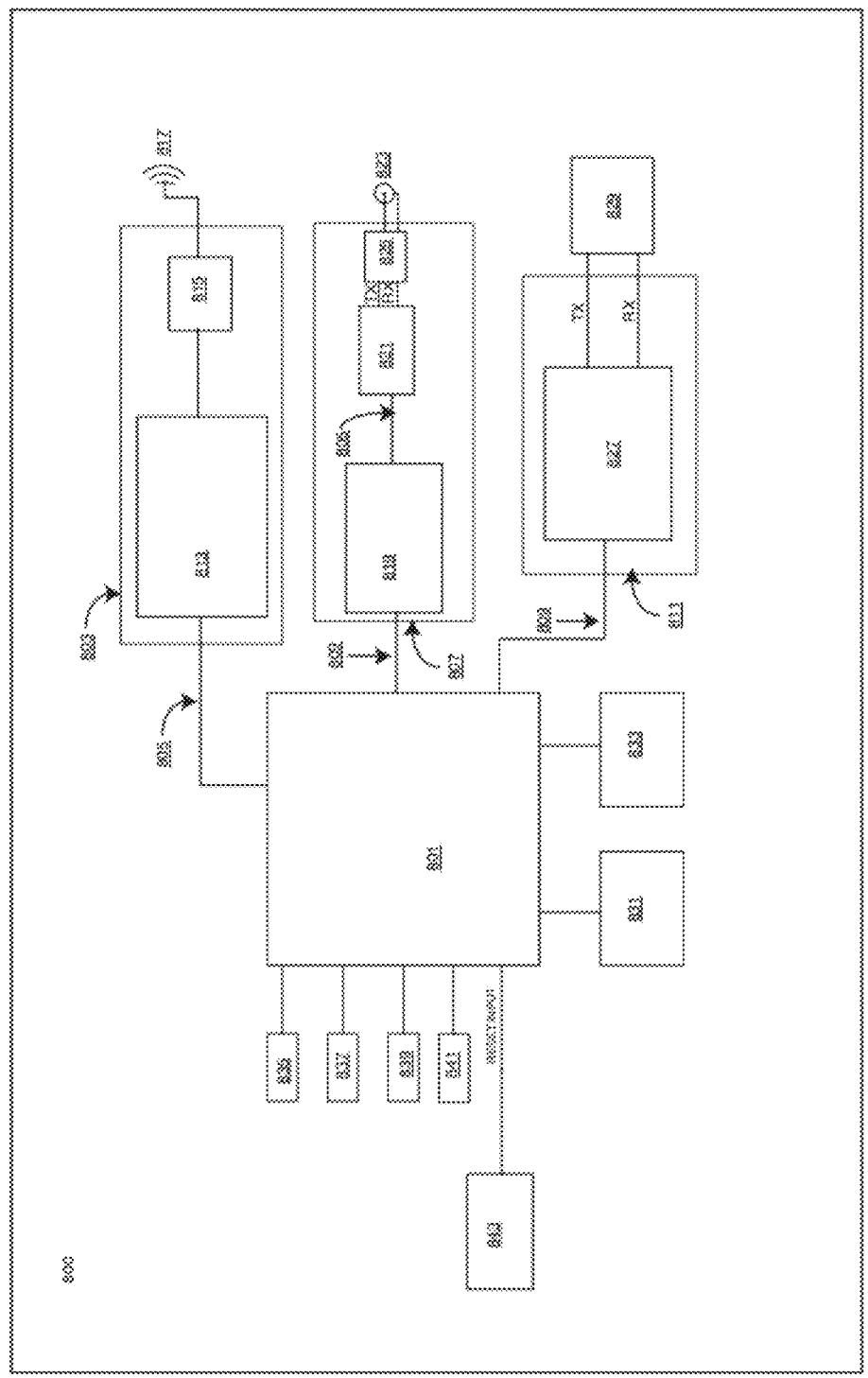
FIG. 8 is a simplified block diagram of apparatus according to an embodiment in the present invention.

FIG. 8 is a simplified block diagram of the co-axial Zigbee modem apparatus 800, according to an embodiment in the present invention. This diagram is merely an example, which should not unduly limit the scope of the claims herein. One of the ordinary skills in the art would recognize many variations, alternatives, and modifications. As shown, the co-axial Zigbee modem apparatus includes a variety of elements. Such elements include a Central Processing Unit (CPU) 801 that connects to a Zigbee network module 803 thru an I/O BUS 805, a Powerline network module 807 thru a MII BUS 809, and an Ethernet network module 811 thru a MII BUS 809. The Zigbee network module 803 includes a variety of elements. Such elements include a Zigbee network chipset 813 that connects directly to an RF output 815 that broadcast the IP signal over 2.4 Ghz 817. The Powerline network module 807 includes a variety of elements. Such elements include a Powerline chipset 819 that connects to an analog front end 821 thru an I/O BUS 805 and is then connected to a co-axial wire 823 using a coupler 825. The Ethernet network module 811 includes a variety of elements. Such elements include a PHY chip 827 that connects to a LAN port 829. The CPU 801 also has other elements, including Parallel Flash 831, Memory 833, Crystal 835, Serial ("UART") 837, a Debug port ("EJTAG") 839, USB port 841, and a reset circuitry 843.

As merely an example, the Zigbee chipset can feature an integrated Zigbee chipset manufactured by EMBER CORPORATION of Massachusetts, according to an embodiment of the present invention, but it would be recognized that other chipsets could be utilized. In alternative embodiments, the Zigbee network module 803 can include other chipset designs that are suitable for the present methods and systems such as other Zigbee chipsets from suitable companies such as TI, Freescale, and others', as well as other wireless networking technologies that are suitable for the present methods and systems such as 61oWPAN, WiFi 802.11, Bluetooth, RFID, and UWB network chipsets from Archrock, Broadcom, Atheros, and others. As noted, the chipsets and companies mentioned are merely an example and should not unduly limit the scope of the claims herein.

As merely an example, the powerline chipset 300 can feature an integrated powerline chipset manufactured by INTELLON CORPORATION of Florida, according to an embodiment of the present invention, but it would be recognized that other chipsets could be utilized. Here, the chip can be a single-chip powerline networking controller with integrated MII/GPSI, USB. The chip interfaces with Ethernet interfaces, among others. Preferably, there is at least a 200 Mbps data rate on the co-axial wire, although others may be desirable, such as 7.5 Kbps, 1 Mbps, 14 Mbps, 85 Mbps, 400 Mbps and 1 Gbps. In alternative embodiments, the shielded network module 300 can include other chipset designs that are suitable for the present methods and systems such as other powerline chipsets from suitable companies such as DS2, Panasonic, Coppergate, Sigma, Arkados, Yitran, Echelon, and others', as well as other networking technologies that are suitable for the present methods and systems such as Home-PNA, MoCA, and UWB network chipsets from Coppergate, Entropic, and others. As noted, the chipsets and companies mentioned are merely an example and should not unduly limit the scope of the claims herein.

Figure 9:
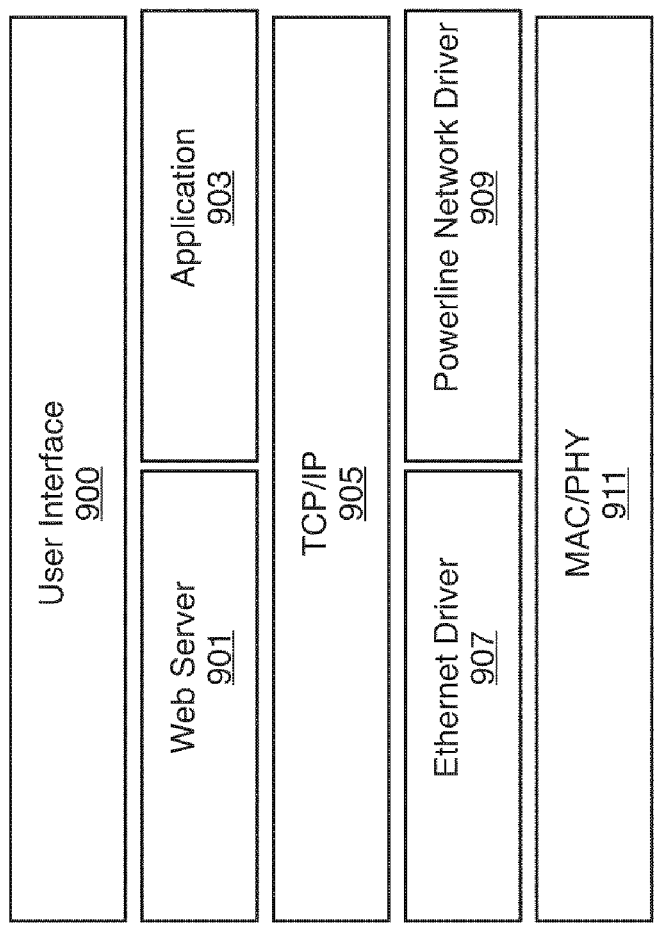
FIG. 9 is a simplified block diagram of the software structure of the co-axial controller.

FIG. 9 is a simplified block diagram of the co-axial controller software structure, according to an embodiment in the present invention. This diagram is merely an example, which should not unduly limit the scope of the claims herein. One of the ordinary skills in the art would recognize many variations, alternatives, and modifications. As shown, the co-axial controller software structure includes a variety of elements. Such elements include a user interface 900, a web server 901, an application layer 903, a TCP/IP stack 905, an Ethernet driver 907, a powerline network stack 909, and a MAC/PHY layer 911.

Figure 10:
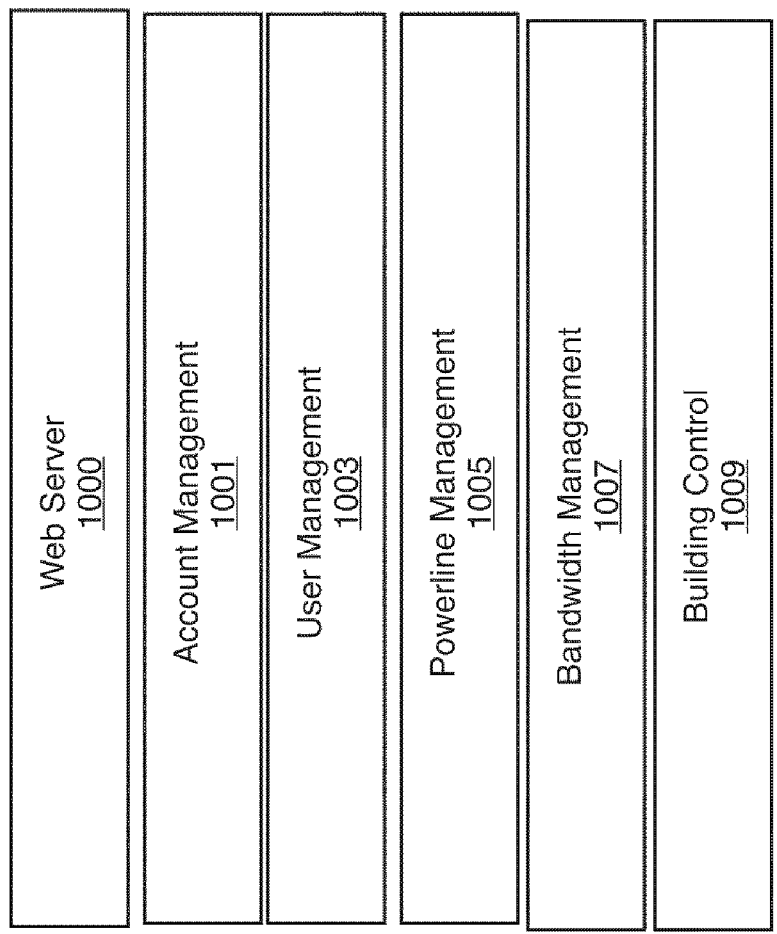
FIG. 10 is a simplified block diagram of the software features of the co-axial controller.

FIG. 10 is a simplified block diagram of the co-axial controller software application modules, according to an embodiment in the present invention. This diagram is merely an example, which should not unduly limit the scope of the claims herein. One of the ordinary skills in the art would recognize many variations, alternatives, and modifications. As shown, the co-axial controller software application modules include a variety of elements. Such elements include a web server module 1000, an account management module 1001, a user management module 1003, a bandwidth management module 1005, a powerline network management module 1007 and a building control management module 1009.

Figure 11:
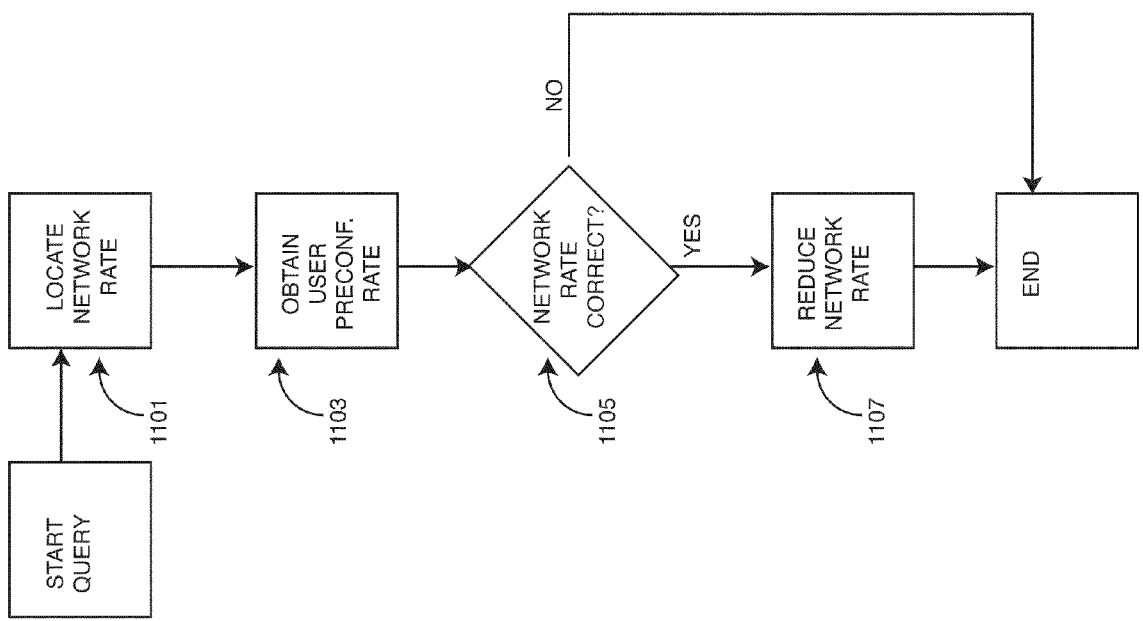
FIG. 11 is a simplified flow diagram for bandwidth management.

FIG. 11 is a simplified flow diagram for the bandwidth management 1100. This diagram is merely an example, which should not unduly limit the scope of the claims herein. One of the ordinary skills in the art would recognize many variations, alternatives, and modifications. As shown, the bandwidth management flow 1100 starts by obtaining the current network rate 1101. The system will then locate what is the user's preconfigured network value 1103. The next step, the system will check to see if the user's preconfigured network value is greater than the current network rate 1105. If the answer given is "yes", the system will reduce the network rate to the user preconfigured network value 1107. Once the network rate is reduced to the user's preconfigured network value, the operation then terminates. If the answer given is "no", the operation will then terminate.

Figure 12:
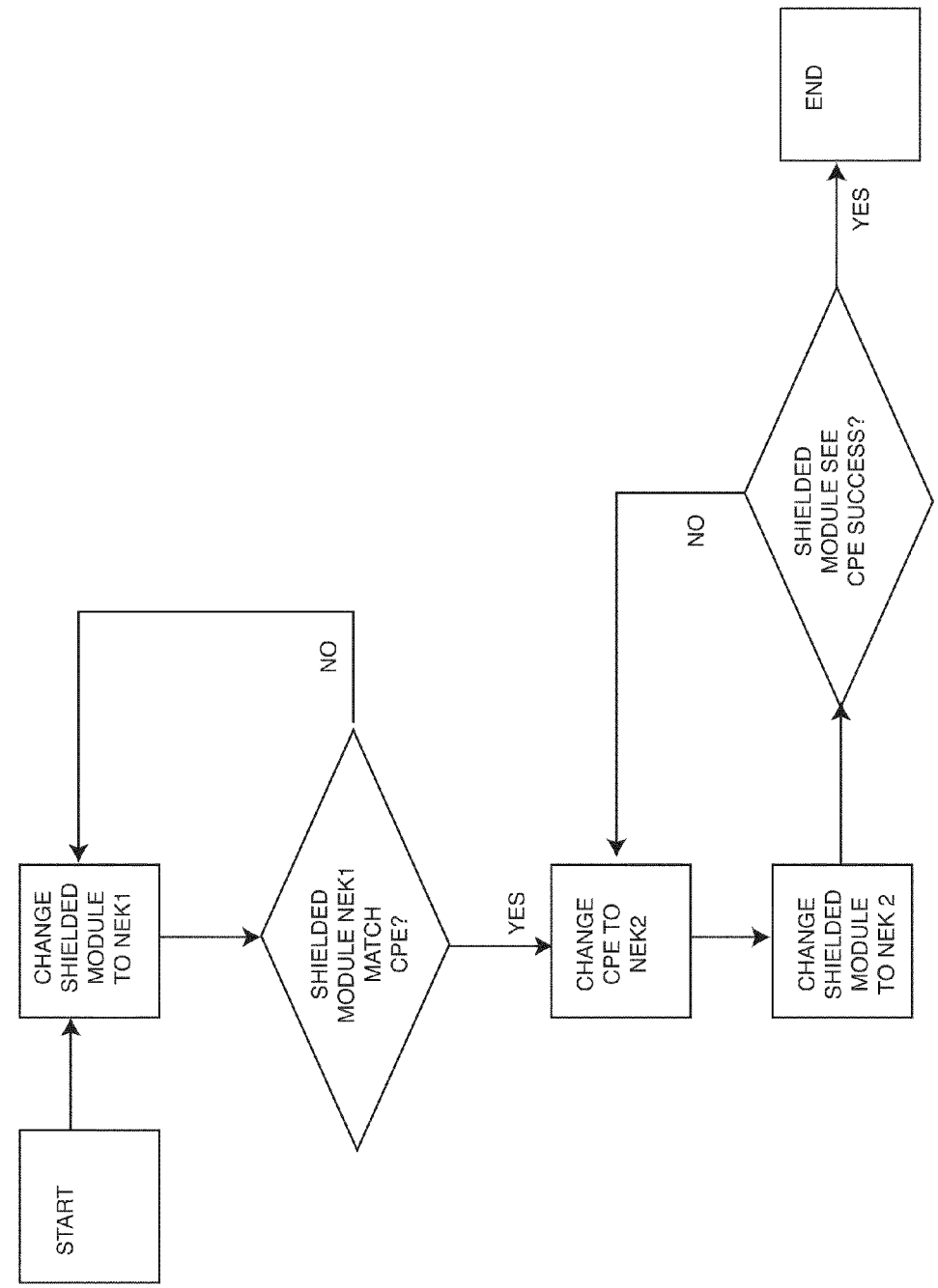
FIG. 12 is a simplified flow diagram for security encryption management.

FIG. 12 is a simplified flow diagram for the security encryption management of 1200. This diagram is merely an example, which should not unduly limit the scope of the claims herein. One of the ordinary skills in the art would recognize many variations, alternatives and modifications. As shown, the security encryption management flow starts 1201 by changing the shielded powerline network module to network encryption key (NEK) A 1203, then the system checks to whether the shielded powerline network module NEK A matches the NEK to the Coax-Zigbee modem or not 1205. If it does not match, the system loops back to change the shielded powerline network module to NEK A 1203. If it does match, the system changes the NEK of the Coax-Zigbee modem to NEK B 1207. The system then changes the shielded powerline network module to NEK B 1209. The next flow process, the system ensures the shielded powerline network module and the Coax-Zigbee modem can see each other 1211. If the shielded powerline network module and the Coax-Zigbee modem cannot see each other, then the system changes the NEK to the Coax-Zigbee modem 1207 and repeats the flow. If the shielded powerline network module and Coax-Zigbee modem can see each other, then the process ends 1209.

Figure 13:
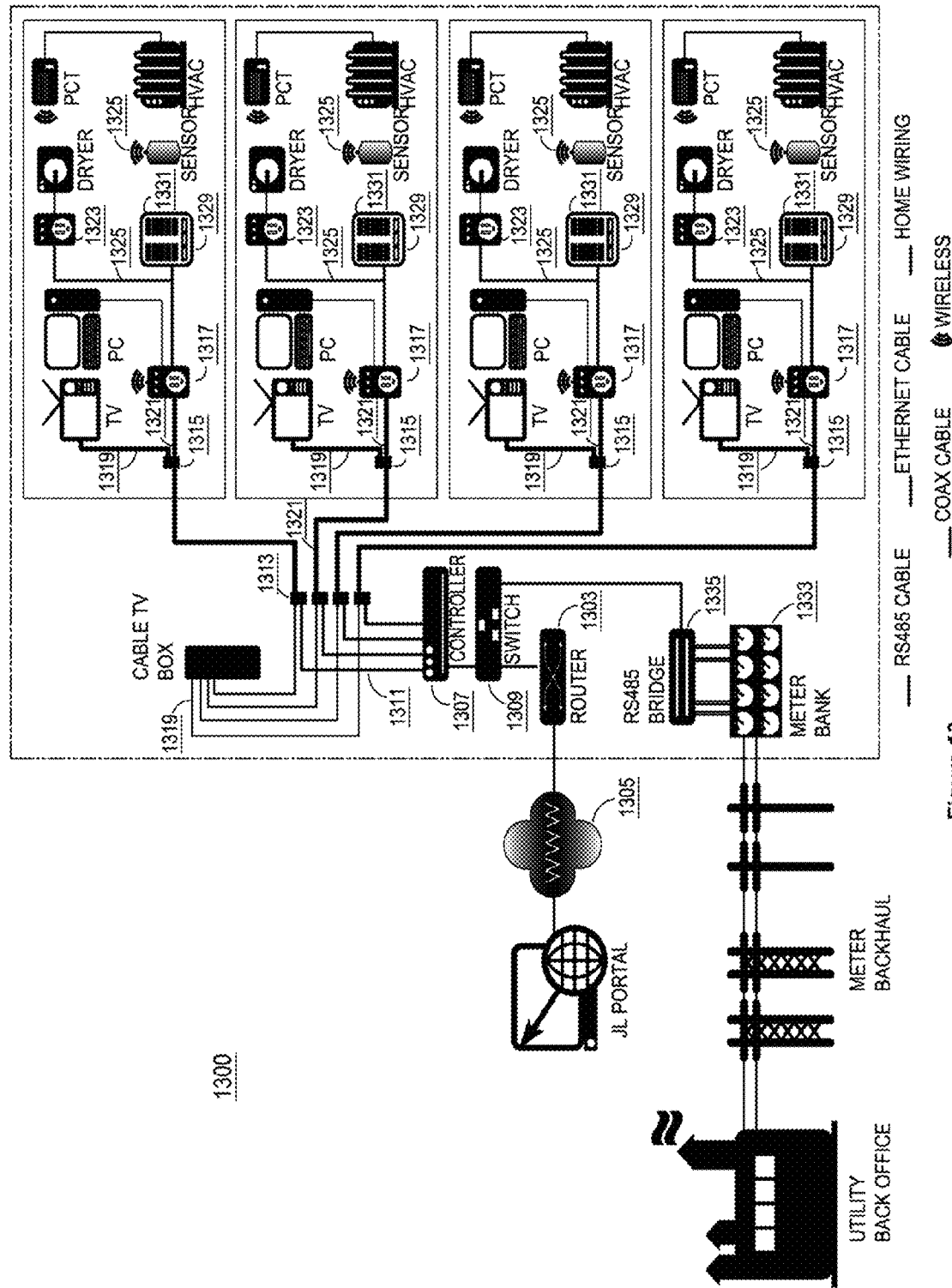
FIG. 13 is an overall system diagram of an energy management system for a multiple unit building associated with respective energy meters according to embodiments of the present invention.

FIG. 13 is an alternative simplified diagram of a high-speed network system for energy management 1300 according to an embodiment of the present invention. This diagram is merely an example, which should not unduly limit the scope of the claims herein. One of the ordinary skills in the art would recognize many variations, alternatives, and modifications. As shown, the system 1300 for a high-speed network for energy management is included. The system 1300 has an external data source 1305, which is derived from a modem or router 1303 that connects to the world-wide networks of computers or world-wide web (WWW) 1305 and provides multiple IP address to the system 1300. A co-axial controller 1307 is coupled to the external data source 1305 through a virtual local area network (VLAN) switch 1309 that is coupled to the modem or router 1303, and is then coupled to a plurality of co-axial wires 1311 and to a meter bank 1333 through a RS485-Ethernet Bridge 1335. The co-axial controller 1307 is adapted to receive and transmit information. As merely an example, the co-axial controller is a product manufactured by Jetlun Corporation of South San Francisco, Calif., under the part number RD61230. The co-axial controller 1307 is a local area network device that splits a first input/output port and a plurality of second input/output ports. Each of the second input/output ports is numbered from 1 through N, where N is an integer greater than 1. A multiplexer 1313 is connected to each of the second input/output ports and is then connected to a splitter 1315 through a co-axial wire, which then connects to a co-axial apparatus 1317. The multiplexer 1313 is adapted to combine an IP signal from the co-axial controller 1307 with a cable TV signal 1319 over a single co-axial wire 1321, and receive and transmit information. As merely an example, the multiplexer 1313 is a product manufactured by Jetlun Corporation of South San Francisco, Calif., under the part number RD61228. The splitter 1315 is adapted to separate the combined signal on the co-axial wire 1321 to an IP signal 1323 and a cable TV signal 1319 and receive and transmit information. As merely an example, the splitter 1315 is a product manufactured by Jetlun Corporation of South San Francisco, Calif., under the part number RD61229. The co-axial apparatus 1317 is adapted to convert the signal from co-axial to an IP signal and can receive and transmit information. As merely an example, the co-axial apparatus is a product manufactured by Jetlun Corporation of South San Francisco, Calif., under the part number RD61227. The co-axial apparatus 1317 may be adapted to collect, aggregate, store, receive and or transmit information, and is also adapted to bridge various network media together. The co-axial apparatus 1317 is adapted to bridge low speed and high-speed powerline technologies and ZigBee wireless technology together. In alternative embodiments, wireless technology can include other wireless technologies such as wireless 802.11 standards, Zwave, 6lowPAN, or others. Client devices may include a variety of apparatus connected through premises AC wiring 1323 or wirelessly 1325, such as appliance module 1327, panel meter 1329, a circuit meter 1331, or a variety of sensors 1333.

An appliance module 1327 can connect to a variety of appliances and devices such as refrigerator, washer and dryer, range, stove, microwave, personal computer, television, or other appliance. An appliance module 1327 may be adapted to measure, store and or control energy usage of connected appliances or devices, bridge Zigbee wireless sensors and devices to the network, or receive and transmit information across network infrastructure. As merely an example, the appliance module 1327 may be a product manufactured by Jetlun Corporation of South San Francisco, Calif., under the part number RD75613.

A circuit meter 1331 may be connected to an electrical circuit breaker panel or distribution panel. A circuit meter 1331 may be adapted to measure and or store energy consumption information of up to sixteen (16) circuits in a distribution panel. As merely an example, the circuit meter 1331 may be a product manufactured by Jetlun Corporation of South San Francisco, Calif., under the part number RD75619.

A panel meter 1329 may be connected to an electrical circuit breaker panel or distribution panel. A circuit meter 1329 may be adapted to measure and or store energy consumption information of up to three (3) circuits in a distribution panel. As merely an example, the circuit meter 1329 may be a product manufactured by Jetlun Corporation of South San Francisco, Calif., under the part number RD75619.

Figure 14:
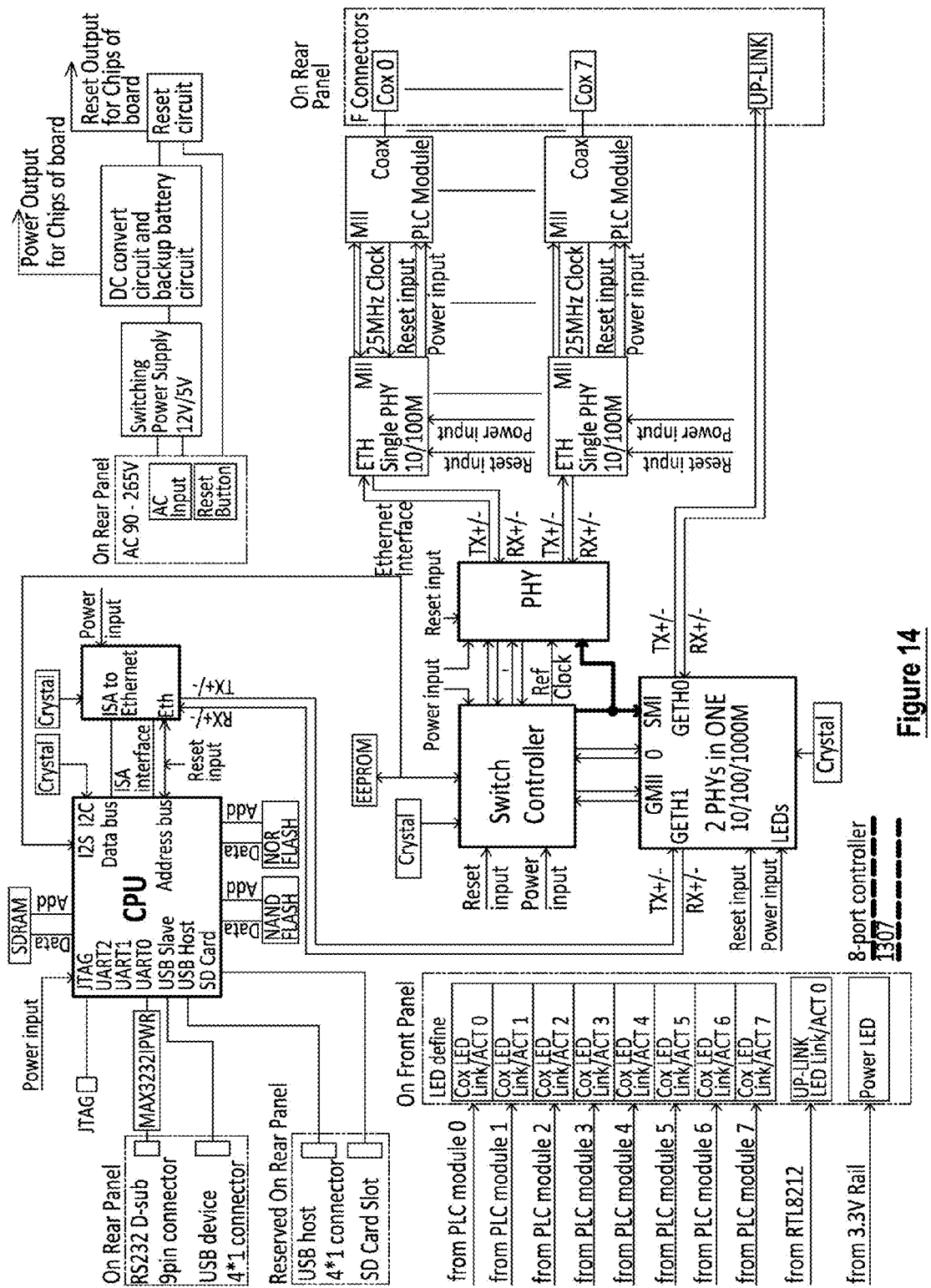
FIG. 14 is a detailed diagram of a controller according to an embodiment of the present invention.

FIG. 14 is a detailed diagram of a controller according to an embodiment of the present invention. This diagram is merely an example, which should not unduly limit the scope of the claims herein. One of ordinary skill in the art would recognize other variations, modifications, and alternatives.

Figure 15:
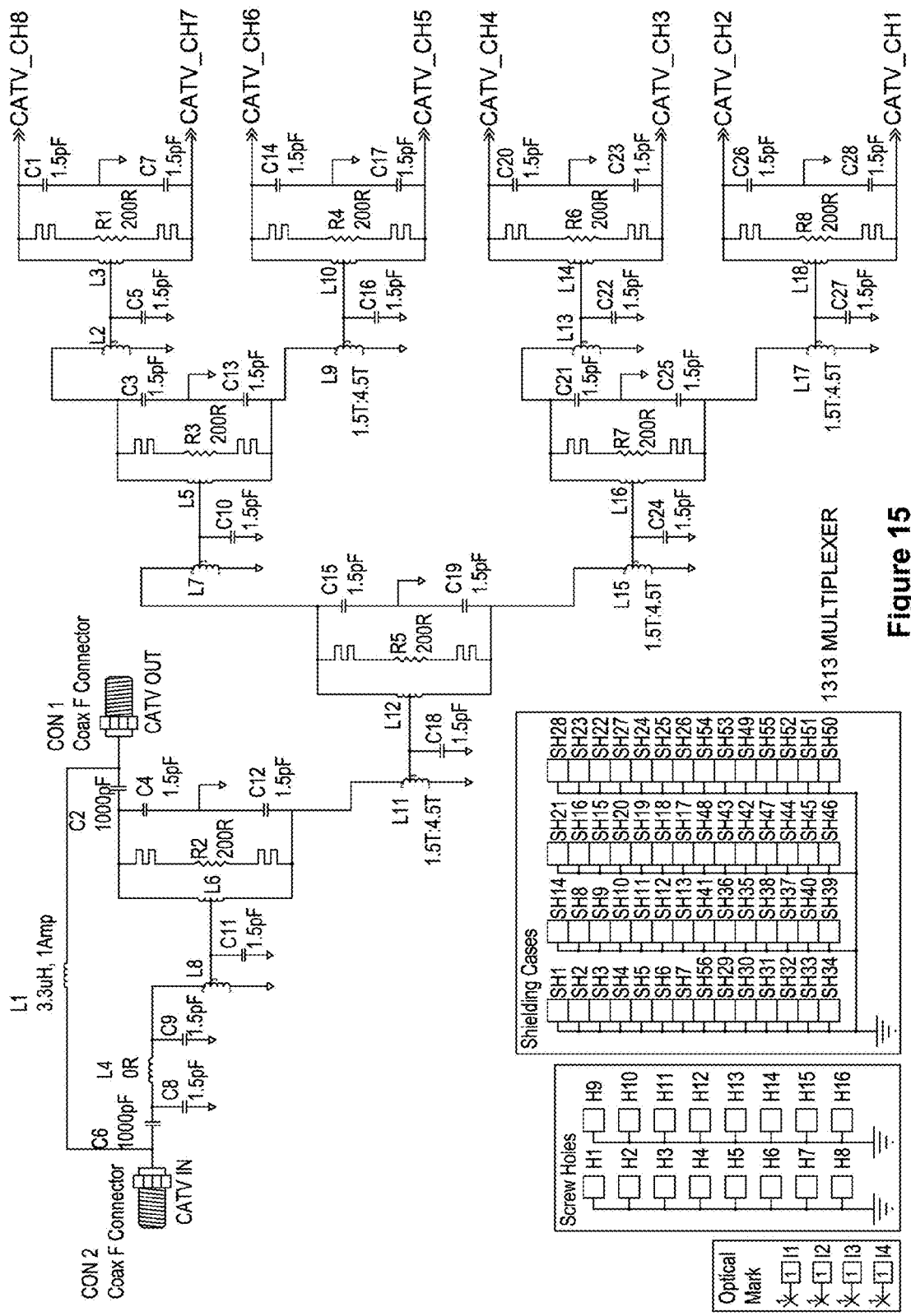
FIG. 15 is a detailed diagram of multiplexer (e.g., 1313) according to an embodiment of the present invention.

FIG. 15 is a detailed diagram of multiplexer 1313 according to an embodiment of the present invention. This diagram is merely an example, which should not unduly limit the scope of the claims herein. One of ordinary skill in the art would recognize other variations, modifications, and alternatives.

Figure 16:
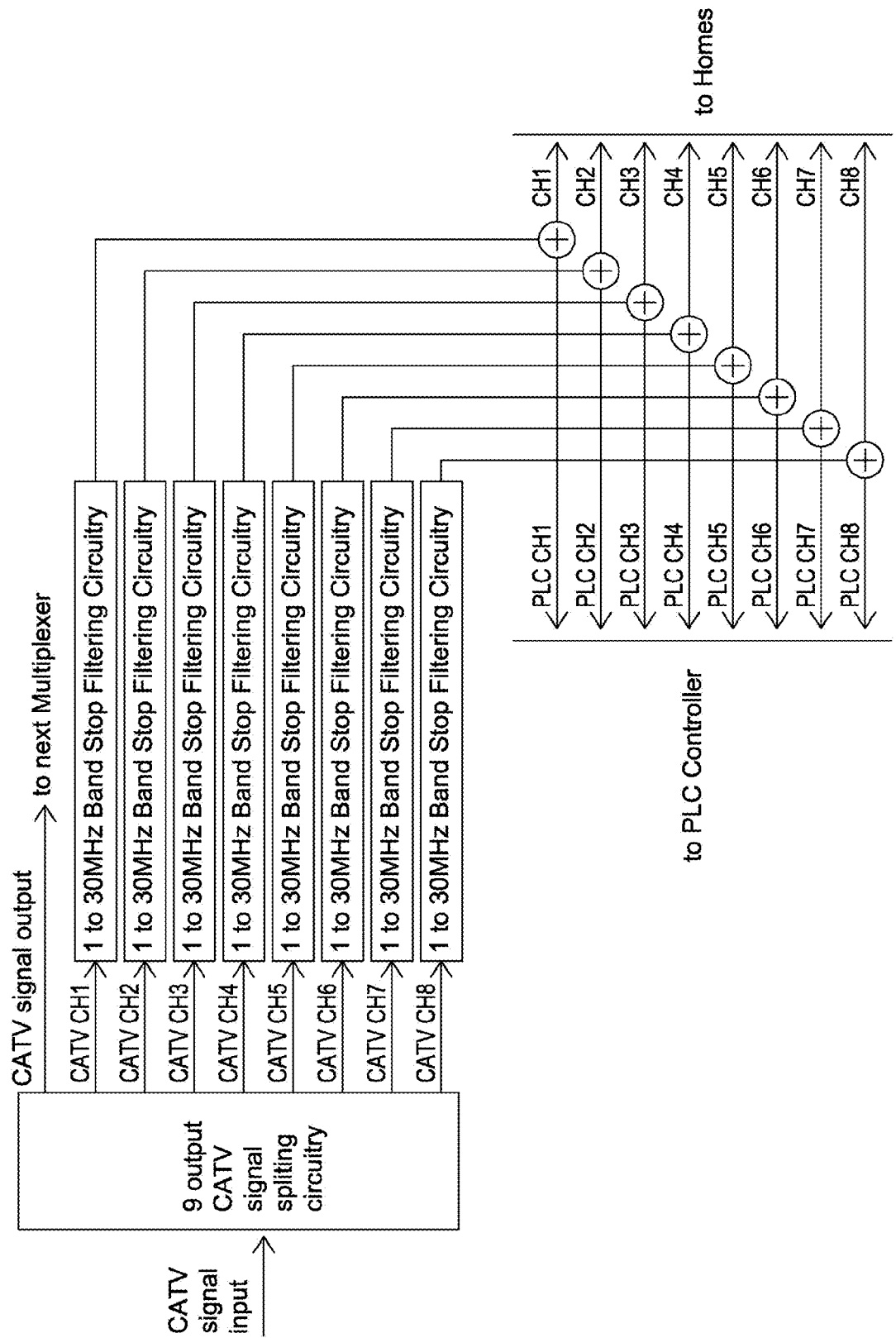
FIGS. 16 to 18 are detailed diagrams of a multiplexer according to an alternative embodiment of the present invention.
Figure 17:
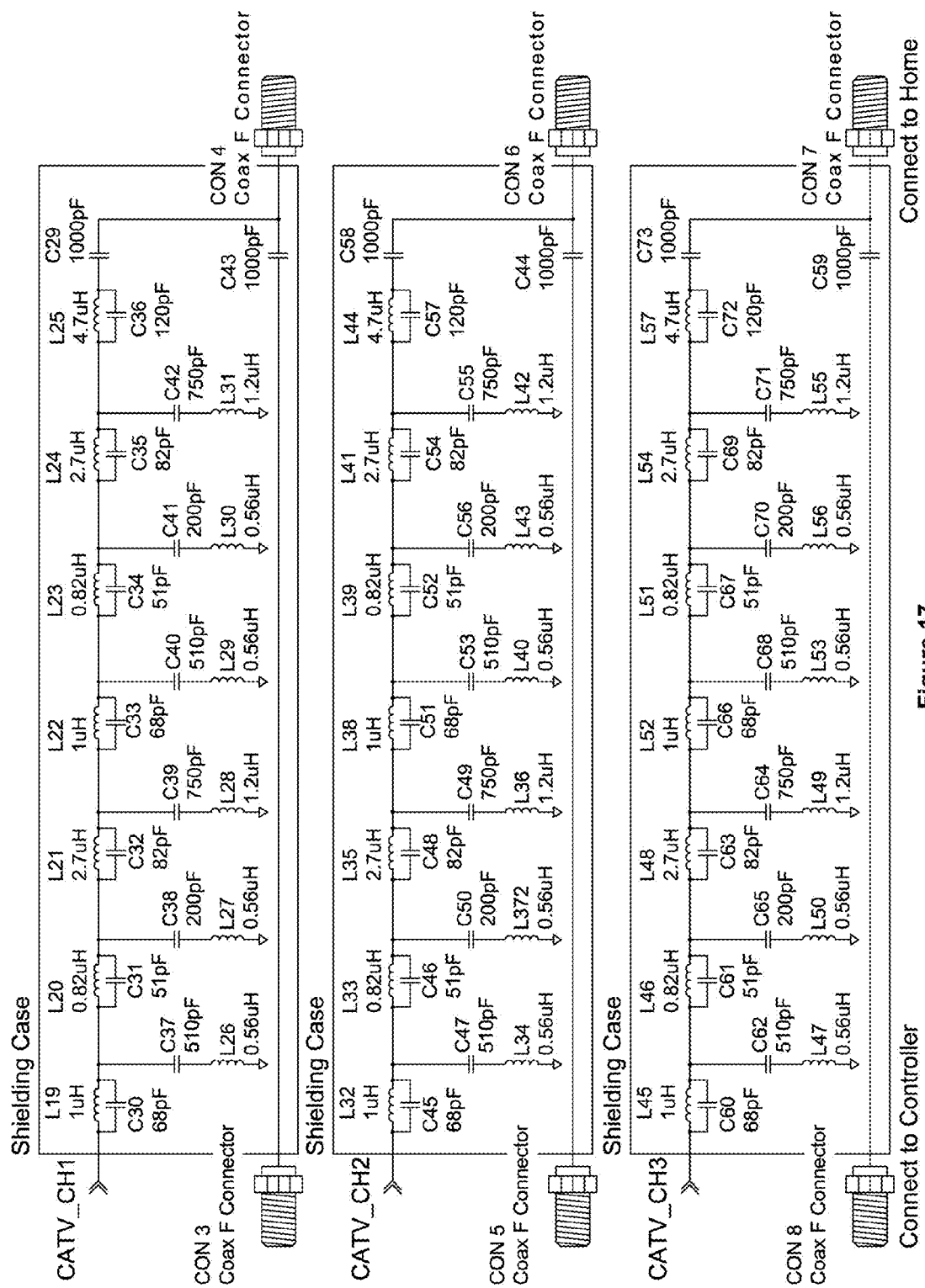
Figure 18:
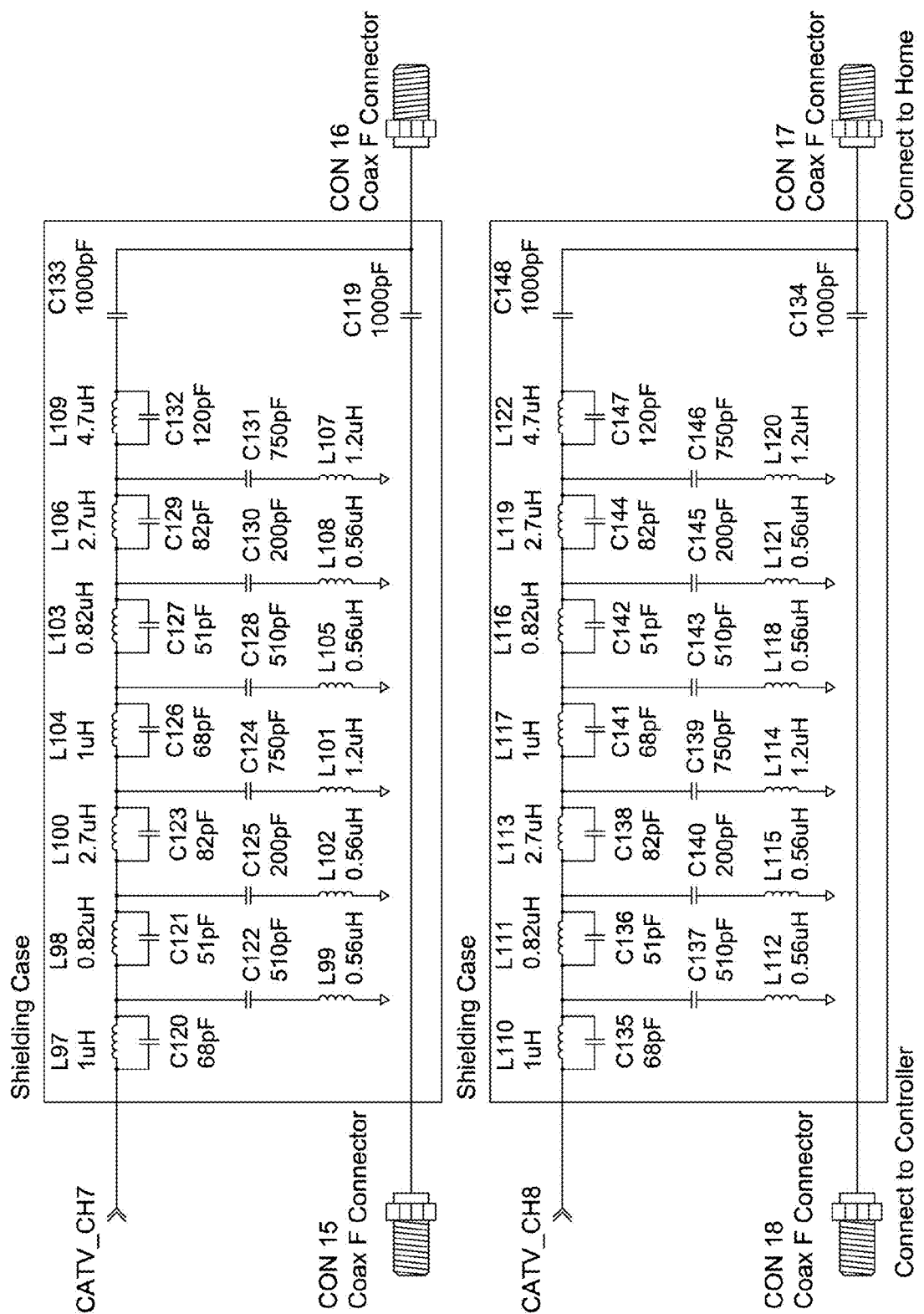

FIGS. 16 to 18 are detailed diagrams of a multiplexer according to an alternative embodiment of the present invention. These diagrams are merely examples, which should not unduly limit the scope of the claims herein. One of ordinary skill in the art would recognize other variations, modifications, and alternatives.

Figure 19:
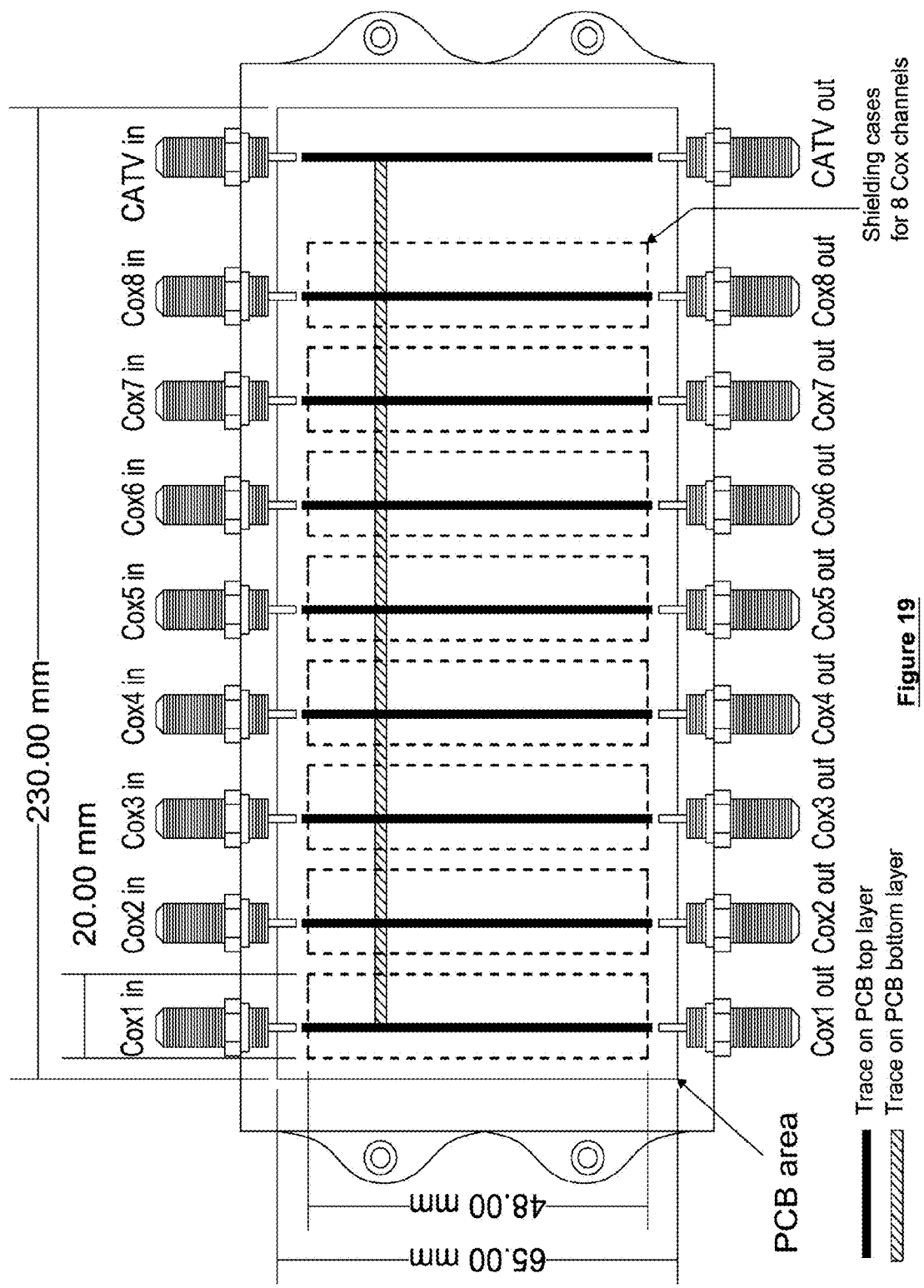
FIGS. 19 and 20 are detailed diagrams of multiplexers according to yet alternative embodiments of the present invention.

FIG. 19 is a detailed diagram of a multiplexer according to yet an alternative embodiment of the present invention. This diagram is merely an example, which should not unduly limit the scope of the claims herein. One of ordinary skill in the art would recognize other variations, modifications, and alternatives.

Figure 20:
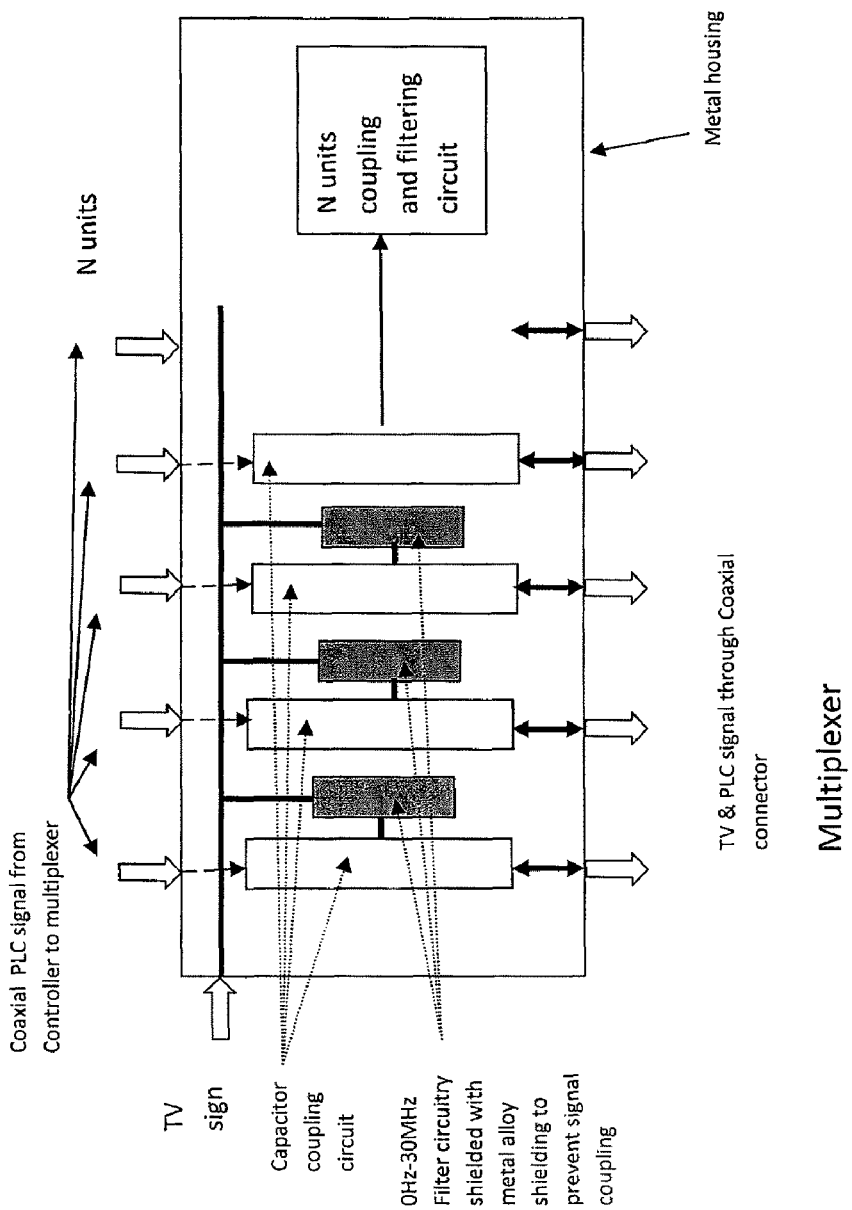

FIG. 20 is a detailed diagram of a multiplexer according to yet an alternative embodiment of the present invention. This diagram is merely an example, which should not unduly limit the scope of the claims herein. One of ordinary skill in the art would recognize other variations, modifications, and alternatives.

Although the above has been described in terms of specific embodiments, other variations, modifications, and alternatives can exist. The specific embodiments are not intended to unduly limit the scope of the claims herein. Further examples can be found throughout the present specification and more particularly below.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An energy management system comprising:
   a coax controller apparatus comprising an exterior housing and plurality of coax modules numbered from 2 through N, where N is an integer greater than 3, each of the coax modules comprising a powerline chip (PLC) module coupled to an analog front end, the analog front end being coupled to a coaxial connector;

an electromagnetic shield configured to each of the coax modules, the electromagnetic shield being configured to substantially maintain the coax module substantially free from interference noise;

a power meter coupled to one or more ports of the coax controller apparatus; and a multiplexer configured between a plurality of power lines numbered from 1 through M and a television broadcasting line, wherein the multiplexer comprises a plurality of capacitor coupling circuits, the plurality of capacitor coupling circuits being coupled, respectively, to the plurality of power lines numbered from 1 through M, each of the plurality of coupling circuits being coupled to a filter configured to remove a frequency ranging from 0 to 30 MHz, the filter being coupled to the television broadcasting line.

2. The energy management system of claim 1 wherein electromagnetic shield comprises metal material.

3. The energy management system of claim 1 wherein each of the coaxial connects is substantially free from noise ranging from 1 MHz to 30 MHz.

4. The energy management system of claim 1 wherein the power meter is configured to transfer at least rate information.

* * * * *